United States Patent [19]

Numata

[11] Patent Number: 5,751,056
[45] Date of Patent: *May 12, 1998

[54] RELIABLE METAL LEADS IN HIGH SPEED LSI SEMICONDUCTORS USING DUMMY LEADS

[75] Inventor: Ken Numata, Dallas, Tex.

[73] Assignee: Texas Instruments Incorporated, Dallas, Tex.

[*] Notice: The term of this patent shall not extend beyond the expiration date of Pat. No. 5,519,250.

[21] Appl. No.: 479,316

[22] Filed: Jun. 7, 1995

Related U.S. Application Data

[62] Division of Ser. No. 250,983, May 31, 1994, abandoned.
[51] Int. Cl.$^6$ ................................ H01L 23/495
[52] U.S. Cl. .............. 257/666; 257/670; 257/671; 257/767
[58] Field of Search ................ 257/666, 668, 257/669, 670, 671, 692, 734, 758, 760, 632, 649, 773, 767

[56] References Cited

U.S. PATENT DOCUMENTS

| | | | |
|---|---|---|---|
| 4,797,375 | 1/1989 | Brownell | 437/187 |
| 4,987,101 | 1/1991 | Kaanta et al. | 437/228 |
| 5,103,288 | 4/1992 | Sakamoto et al. | 357/71 |
| 5,130,782 | 7/1992 | Ashwell | 257/758 |
| 5,155,576 | 10/1992 | Mizushima | 357/71 |
| 5,182,235 | 1/1993 | Eguchi | 437/238 |
| 5,185,653 | 2/1993 | Switty et al. | 257/666 |
| 5,424,577 | 6/1995 | Suzuki et al. | 257/666 |

(List continued on next page.)

FOREIGN PATENT DOCUMENTS

| 3012956 | 1/1991 | Japan | 257/666 |
|---|---|---|---|

OTHER PUBLICATIONS

Fukada, et al., "Preparation of SiOF Films with Low Dielectric Constant by ECR Plasma Chemical Vapor Deposition", International Conference of Solid State Devices and Materials, 1993, pp. 158–160.

Bruesch, et al., "Electrical and Infrared Dielectrical Properties of Silica Aerogels and of Silica–Aerogel–Based Composites", Appl. Phys. A57, 1993, pp. 329–337.

Ito, et al., "Application of Surface Reformed Thick Spin–on– Glass to MOS Device Planarization", Electrochem. Soc., vol. 137, No. 4, Apr. 1990, pp. 1213–1218.

"Chronological Scientific Tables" Ed. Tokyo Astronomical Observatory, Published by Maruzen, Tokyo (1986).

Goodson, et al., "Annealing–Temperature Dependence of the Thermal Conductivity of LPCVD Silicon–Dioxide Layers", IEEE Device Letters, vol. 14, No. 10, Oct., 1993, pp. 490–492.

E.U. Condon, Ph.D., "Heat and Thermodynamics", Handbook of Physics, Second Edition.

Musaka, et al., "Single Step Gap Filling Technology for Subhalf Micron Metal Spacings on Plasma Enhanced TEOS/$O_2$ Chemical Vapor Deposition System", Applied Materials Japan Inc. Technolgy Center, pp. 510–512.

USAMIet al., "Low Dielectirc Constant Interlayer Using Flouride Doped Silicon Oxide", 1993 International Copnference on Solid State Devices and Materials, Makuhari, pp. 161–163.

*Primary Examiner*—Carl W. Whitehead
*Attorney, Agent, or Firm*—Kay Houston; W. James Brady, III; Richard L. Donaldson

[57] ABSTRACT

A semiconductor device having metal leads 14 with improved reliability comprising metal leads 14 on a substrate 12, a low-dielectric constant material 18 at least between the metal leads 14, and dummy leads 16 proximate the metal leads 14. Heat from the metal leads 14 is transferable to the dummy leads 16, and the dummy leads 16 are capable of dissipating the heat. The low-dielectric constant material 18 has a dielectric constant of less than 3.5. An advantage of the invention is improved reliability of metal leads for circuits using low-dielectric constant materials.

13 Claims, 1 Drawing Sheet

U.S. PATENT DOCUMENTS

| | | | |
|---|---|---|---|
| 5,441,915 | 8/1995 | Lee | 437/195 |
| 5,459,093 | 10/1995 | Kuroda et al. | 437/51 |
| 5,486,493 | 1/1996 | Jeng | 437/195 |
| 5,510,293 | 4/1996 | Numata | 437/195 |
| 5,512,775 | 4/1996 | Cho | 257/522 |
| 5,519,250 | 5/1996 | Numata | 257/632 |
| 5,591,677 | 1/1997 | Jeng | 437/195 |
| 5,616,959 | 4/1997 | Jeng | 257/758 |

RELIABLE METAL LEADS IN HIGH SPEED LSI SEMICONDUCTORS USING DUMMY LEADS

This is a division of application Ser. No. 08/250,983, filed May 31, 1994, now abandoned.

CROSS-REFERENCE TO RELATED APPLICATIONS

The following co-assigned U.S. patent applications are hereby incorporated herein by reference:

| Serial No | Filing Date | Inventor | Status | Title |
|---|---|---|---|---|
| 08/137,658 | 10/15/93 | Jeng | abandoned | Planarized Structure for Line-to-Line Capacitance Reduction |
| 08/280,406 | 7/26/94 | " | pending | Planarized Structure for Line-to-Line Capacitance Reduction |
| 08/201,679 | 2/25/94 | Jeng et al | abandoned | Selective Filling Narrow Gaps with Low-dielectric-constant materials |
| 08/427,631 | 4/21/95 | " | abandoned | Selective Filling Narrow Gaps with Low-dielectric-constant materials |
| 08/202,057 | 2/25/94 | Jeng | abandoned | Planarized Multilevel Interconnect Scheme with Embedded Low-Dielectric-Constant Insulators |
| 08/430,095 (U.S. Pat. No. 5,486,493) | 4/26/95 | " | issued | Planarized Multilevel Interconnect Scheme with Embedded Low-Dielectric-Constant Insulators |
| 08/473,458 (U.S. Pat. No. 5,616,959) | 6/7/95 | " | issued | Planarized Multilevel Interconnect Scheme with Embedded Low-Dielectric-Constant Insulators |
| 08/455,765 (U.S. Pat. No. 5,591,677) | 5/31/95 | " | issued | Planarized Multilevel Interconnect Scheme with Embedded Low-Dielectric-Constant Insulators |
| 08/234,443 | 4/28/94 | Cho | pending | Low Dielectric Constant Insulation in VLSI applications |
| 08/483,591 (U.S. Pat. No. 5,512,775) | 6/7/95 | " | issued | Low Dielectric Constant Insulation in VLSI applications |
| 08/234,099 | 4/27/94 | Havemann | pending | Via Formation in Polymeric Materials |
| 08/476,293 | 6/7/95 | " | pending | Via Formation in Polymeric Materials |
| 08/247,195 (U.S. Pat. No. 5,470,802) | 5/20/94 | Gnade et al | issued | A Low Dielectric Constant Material for Electronics Applications |
| 08/483,029 | 6/7/95 | " | pending | A Low Dielectric Constant Material for Electronics Applications |
| 08/473,701 | 6/7/95 | " | abandoned | A Low Dielectric Constant Material for Electronics Applications |
| 08/735,758 | 10/23/96 | " | pending | A Low Dielectric Constant Material for Electronics Applications |
| 08/246,432 (U.S. Pat. No. 5,488,015) | 5/20/94 | Havemann et al | issued | Interconnect Structure with an Integrated Low Density Dielectric |
| 08/473,840 | 6/7/95 | " | abandoned | Interconnect Structure with an Integrated Low Density Dielectric |
| 08/751,901 | 11/18/96 | " | pending | Interconnect Structure with an Integrated Low Density Dielectric |
| 08/250,063 (U.S. Pat. No. 5,461,003) | 5/27/94 | Havemann et al | issued | Multilevel Interconnect Structure with Air Gaps Formed Between Metal Leads |
| 08/428,814 | 4/24/95 | " | abandoned | Multilevel Interconnect Structure with Air Gaps Formed Between Metal Leads |
| 08/631,437 | 4/12/96 | " | pending | Multilevel Interconnect Structure with Air Gaps Formed Between Metal Leads |
| 08/811,021 | 3/4/97 | " | pending | Multilevel Interconnect Structure with Air Gaps Formed Between Metal Leads |
| 08/250,142 | 5/27/94 | Havemann | abandoned | Two-step Metal Etch Process for Selective Gap Fill of Submicron Interconnects and Structure for Same |
| 08/606,657 | 2/26/96 | " | pending | Two-step Metal Etch Process for Selective Gap Fill of Submicron Interconnects and Structure for Same |
| 08/481,720 | 8/22/95 | " | pending | Two-step Metal Etch Process for Selective Gap Fill of Submicron Interconnects and Structure for Same |
| 08/667,774 | 6/21/96 | " | pending | Two-step Metal Etch Process for Selective Gap Fill of Submicron Interconnects and Structure for Same |
| 08/250,747 | 5/27/94 | Gnade et al | pending | Low Dielectric Constant Layers via Immiscible Sol-gel Processing |

The following U.S. patent applications filed concurrently with the patent application for the present invention, are also incorporated herein by reference:

| Serial No. | Inventor | Title |
|---|---|---|
| 08/251,822 (U.S. Pat. No. 5,510,293) | Numata | Method of Making Reliable Metal Leads in High Speed LSI Semiconductors using Thermoconductive Dielectric Layer |
| 08/250,888 (U.S. Pat. No. 5,476,817) | Numata | Method of Making Reliable Metal Leads in High Speed LSI Semiconductors using both |

-continued

| Serial No. | Inventor | Title |
| --- | --- | --- |
| 08/486,305 (U.S. Pat. No. 5,519,200) | Numata | Dummy Leads and Thermoconductive Dielectric Layer Method of Making Reliable Metal Leads in High Speed LSI Semiconductors using both Dummy Leads and Thermoconductive Dielectric Layer |

FIELD OF THE INVENTION

This invention relates generally to the fabrication of semiconductor devices, and more specifically to semiconductors with submicron spacing and low-dielectric materials between the intermetallic leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections.

Semiconductor devices are being scaled in the horizontal dimension to reduce wafer cost by obtaining more chips per wafer or by increasing circuit complexity by obtaining more transistors per chip. Although semiconductor devices are being scaled in the horizontal dimension, semiconductor devices are not generally being scaled in the vertical dimension (because the current density would exceed reliability limits). Thus, conductors may have a high aspect ratio (ratio of conductor height to conductor width of greater than one). With horizontal scaling, these tall metal leads are being packed closer and closer together, causing capacitive coupling between the leads to become the primary limitation to circuit speed. If line-to-line capacitance is high, a likelihood for electrical inefficiencies and inaccuracies exist. Reducing the capacitance within these multi-level metallization systems will reduce the RC time constant between the lines.

Typically, the material used to isolate metal lines from each other is silicon dioxide. However, the dielectric constant of dense silicon oxide grown by thermal oxidation or chemical vapor deposition is on the order of 3.9. The dielectric constant is based on a scale where 1.0 represents the dielectric constant of a vacuum. Various materials exhibit dielectric constants from very near 1.0 to values in the hundreds. As used herein, the term low-dielectric will refer to a material with a dielectric constant of less than 3.5.

SUMMARY OF THE INVENTION

Recently, attempts have been made to use low-dielectric materials to replace silicon dioxide as a dielectric material. The use of low-dielectric materials as insulating layers reduces the capacitance between the lines (or leads), thus reducing the RC time constant. An apparently heretofore-unrecognized problem (especially in high aspect ratio metal leads) is that the decreased thermal conductivity of low-dielectric constant materials may result in metal lead breakage due to the effects of Joule's heat. The present invention solves this problem by improving the thermal conductivity of the structure, resulting in improved reliability of metal leads in structures using low-dielectric materials.

The invention encompasses a method for manufacturing semiconductor devices having metal leads with improved reliability, and a device for same, comprising metal leads on a substrate, a low-dielectric constant material at least between the metal leads, and dummy leads proximate the metal leads. Heat from the metal leads is transferable to the dummy leads, and the dummy leads are capable of dissipating the heat. The low-dielectric constant material has a dielectric constant of less than 3.5. An advantage of the invention is to improve reliability of metal leads for circuits using low-dielectric constant materials.

One preferred embodiment of the invention involves depositing a metal interconnect layer on a substrate and etching the metal interconnect layer in a predetermined pattern to form metal leads and dummy leads, where the dummy leads are proximate the metal leads. Then, a low-dielectric constant material is deposited between the metal leads and the dummy leads. Another embodiment involves depositing a first metal interconnect layer on a substrate and etching the first metal interconnect layer in a predetermined pattern to form metal leads. Then a low-dielectric constant material is deposited between the metal leads. A thin oxide layer is deposited over low-dielectric constant material, and a second metal interconnect layer is deposited on the thin oxide layer. The second interconnect layer is etched in a predetermined pattern to form dummy leads, wherein the dummy leads are adjacent a portion of the metal leads of the first metal interconnect layer. Heat from the metal leads is transferable to the dummy leads and dissipatable. The low-dielectric constant material has a dielectric constant of less than 3.5.

An advantage of the invention is to improve reliability of metal leads for circuits using low-dielectric constant materials. The invention is particularly beneficial to semiconductors having a combination of metal leads with high aspect ratios and low-dielectric constant materials which are more thermally insulating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figure 1A:
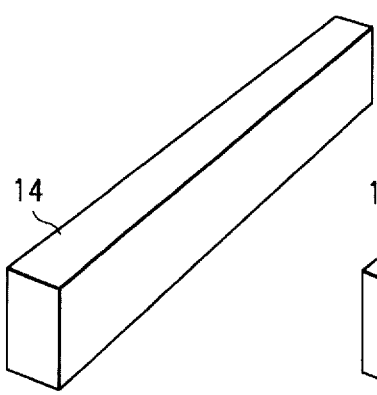
FIGS. 1A–1C are three-dimensional views of a metal lead of a semiconductor wafer, showing the negative effects of Joule's heat.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semiconductor wafer | |
| 12 | Silicon | Substrate | May be other metal interconnect layers or semiconductor elements, (e.g. transistors, diodes); Oxides; Compound semiconductors (e.g. GaAs, InP, Si/Ge, SiC). |
| 14 | Aluminum alloy | Metal leads | Titanium trilayer (TiN/AlCu/TiN); Alloys of Cu, Mo, W, Ti, Si; Polysilicon, silicides, nitrides, carbides; AlCu alloy with Ti or TiN underlayers; Metal interconnect layer. |
| 16 | Aluminum alloy | Dummy leads | Titanium trilayer (TiN/AlCu/TiN); Alloys of Cu, Mo, W, Ti, Si; Polysilicon, silicides, nitrides, carbides; AlCu alloy with Ti or TiN underlayers. |
| 18 | OSOG (organic spin-on glass) | Low-dielectric constant material | Air gap (also inert gases, vacuum); silica aerogel; other aerogels or xerogels; fluorinated silicon oxide. |
| 20 | SiO$_2$ | Thin oxide layer | Insulating layer preferably having a thickness less than the height of metal leads 14 |

An apparently heretofore-unrecognized problem is that the decreased thermal conductivity of low-dielectric materials may result in metal lead breakage due to the effects of Joule's heat, especially in high aspect ratio conductors with low-dielectric constant material between conductors, where the low-dielectric material is on more than half the conductor perimeter. Since all metals have a certain amount of resistance, the temperature of a metal rises as a current passes through it. Such heat through a metal lead is known as Joule's heat. As a metal lead heats locally in one portion along it, the resistance in that portion rises slightly (due to properties of the metal), causing the temperature in that portion to rise even more (although slightly). Thus, locally heated metal leads can be damaged or fractured. The thinner the metal lead, the weaker it is (which is particularly a concern in submicron circuits). The use of low-dielectric constant materials as insulative layers further present a problem, for such materials generally have poor thermoconductivity. With the use of low-dielectric constant materials, much more of the Joule's heat generated in metal leads of a circuit remains concentrated in the lead itself.

Figure 1B:
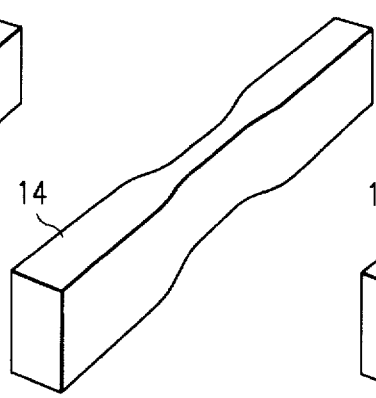
Figure 1C:
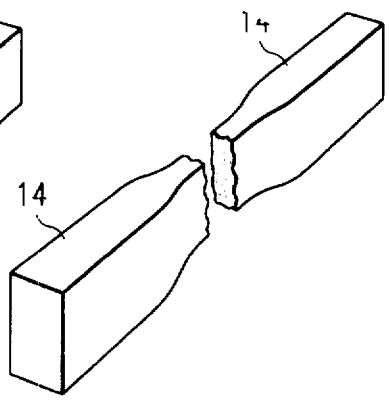

The effect of Joule's heat on a metal lead is shown in FIG. 1. FIG. 1A shows a metal lead 14 of a semiconductor wafer (other portions of the wafer are not shown). When current flows through metal lead 14, the metal lead is heated. In reality, a metal lead has thin and fragile portions. Such unevenness cannot be avoided because photolithography and etching processes of metal leads are not ideal. Electromigration, intensified by Joule's heat, causes the metal lead to first weaken, and then thin. Thin and fragile portions of the metal lead becomes thinner and thinner as current is cycled through the metal lead (FIG. 1B), and electromigration is even further intensified in this portion. Eventually such leads can break, as shown in FIG. 1C, resulting in device failures.

Figure 2A:
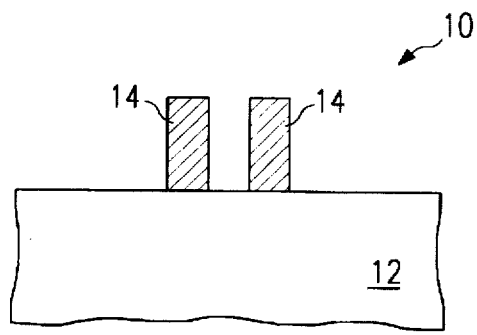
FIGS. 2A–2C are cross-sectional views of a first embodiment of the present invention, showing dummy leads formed on a semiconductor wafer.

The present invention improves reliability of metal leads in structures using low-dielectric constant materials by using dummy leads to improve the thermal conductivity of the structure. FIG. 2A shows a cross-sectional view of a semiconductor wafer 10 having metal leads 14 formed on a substrate 12. The substrate may, for example, contain transistors, diodes, and other semiconductor elements (not shown) as are well known in the art. The substrate 12 may also contain other metal interconnect layers, and typically contains a top insulating oxide layer (to prevent leads from shorting to each other in subsequent metal layers). A first metal interconnect layer has been deposited over the substrate 12. The first metal interconnect layer may comprise, for example, aluminum or a titanium-tungsten/aluminum bilayer. The first metal interconnect layer is etched with a predetermined pattern to form etch lines, or metal leads 14. Some of the metal leads 14 may be in close proximity to each other, for example, 1 µm or less apart.

Figure 2B:
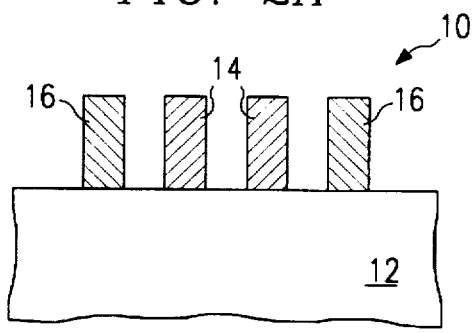
Figure 2C:
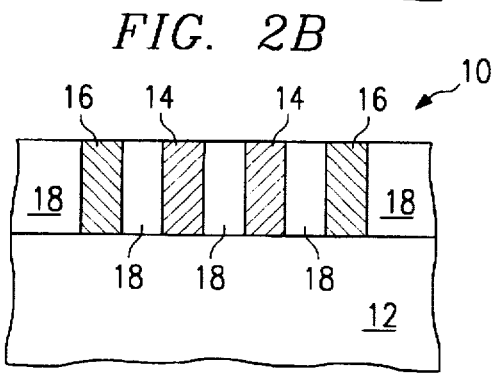
Figure 3A:
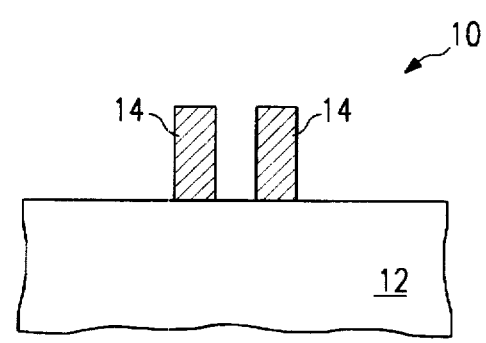
FIGS. 3A–3B are cross-sectional views of a second embodiment of the present invention, showing dummy leads formed on a semiconductor wafer.
Figure 3B:
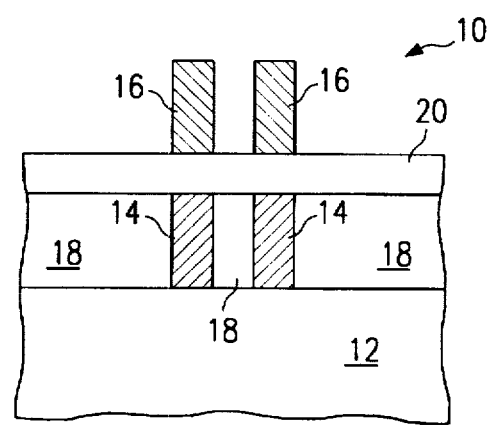

FIG. 2B shows the same semiconductor device as in FIG. 2A, with a first embodiment of the present invention implemented. Dummy leads 16 are formed adjacent metal leads 14 in the same metal interconnect as metal leads 14 are formed in. The dummy leads 16 diffuse some of the Joule's heat away from the metal leads 14 when the device is in operation. A low-dielectric constant material, preferably an organic spin-on glass (OSOG), is subsequently deposited between the metal leads and dummy leads, as shown in FIG. 2C. Although low-dielectric constant material 18 may be a poor thermal conductor, it is relative thin, allowing some of the Joule's heat to be diffused away from the metal leads 14 through dummy leads 16. Since dummy leads 16 are comprised of metal, they are excellent thermal conductors. The dummy leads 16 are generally spaced apart from the metal leads 14 a distance of about one lead width. A second embodiment of the present invention is shown in FIG. 3, where dummy leads 16 are formed in an adjacent parallel metal layer. Semiconductor wafer 10 comprises a substrate 12. A first metal interconnect layer is deposited over the substrate 12, and metal leads 14 are formed in the first metal interconnect layer. A low-dielectric constant material 18 is formed between the metal leads 14, as shown in FIG. 3A. Then a relatively thin oxide layer 20 (preferably having a thickness less than the height of metal leads 14) is deposited on the metal leads 14 and the low-dielectric constant material 18. A second metal interconnect layer (adjacent and parallel to first metal interconnect layer) is deposited over thin oxide layer 20, and dummy leads 16 are formed adjacent the metal leads 14 (see FIG. 3B). The thin oxide layer 20 must be thin enough to allow some of the Joule's heat from underlying metal leads 14 to migrate through the thin oxide layer 20 to reach the dummy leads 16 formed in the second metal interconnect layer. A portion of the Joule's heat from metal leads 14 is transferable through thin oxide layer 20 to dummy leads 16. Subsequent processing steps may then be performed e.g. further deposition and etching of semiconductor, insulative and metallic layers.

The present invention can also be used on semiconductors using other low-dielectric constant materials, such as air gaps, aerogels, xerogels, or fluorinated silicon oxide, for example. To reduce this capacitive coupling, low-dielectric constant materials are being investigated, such as pure polymers (e.g. parylene, teflon, polyimide) or organic spin-on glass (OSOG, e.g. silsequioxane or siloxane glass). Refer to U.S. Pat. No. 4,987,101 issued to Kaanta et al on Jan. 22, 1991 which describes a method for fabricating gas (air) dielectrics; and U.S. Pat. No. 5,103,288 issued to Sakamoto on Apr. 7, 1992 which describes a multilayered wiring structure which decreases capacitance by using a porous dielectric.

The novel method of using dummy leads to dissipate heat from metal leads is beneficial to semiconductors having submicron spacing and using low-dielectric constant materials. The dummy leads diffuse a portion of the Joule's heat generated in the metal leads, enhancing reliability of metal leads. The invention is particularly beneficial to semiconductors having a combination of metal leads with high aspect ratios (e.g. 2 or greater) and low-dielectric constant materials (especially having a low-dielectric constant of less than 2) which are more thermally insulating.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device having metal leads with improved reliability, comprising:

a substrate;

at least two functional metal leads on said substrate;

a low-dielectric constant insulating material at least between said functional metal leads; and dummy leads proximate said functional metal leads, wherein dummy leads are in such proximity to said functional metal leads as to dissipate Joule's heat from said functional metal leads, and wherein said low-dielectric constant insulating material has a dielectric constant of less than 3.5.

2. The semiconductor device of claim 1 wherein the spacing between said functional metal leads is less than one μm.

3. The semiconductor device of claim 1 wherein:

said dummy leads reside on said substrate proximate said functional metal leads; and the spacing between said functional metal leads and said dummy leads is between ½ and 1½ the width of a said functional metal lead.

4. The semiconductor device of claim 1 further comprising a thin oxide layer over at least said low-dielectric constant insulating material.

5. The semiconductor device of claim 4 wherein:

said thin oxide layer has a thickness of less than the width of a said functional metal lead;

said low-dielectric constant insulating material has a low-dielectric constant of less than 2; and said functional metal leads have an aspect ratio greater than 2.

6. A semiconductor device having metal leads with improved reliability, comprising:

a substrate;

at least two functional metal leads on said substrate;

a low-dielectric constant insulating material at least between said functional metal leads; and dummy leads on said substrate proximate said functional metal leads;

wherein dummy leads are in such proximity to said functional metal leads as to dissipate Joule's heat from said functional metal leads, said low-dielectric constant insulating material has a dielectric constant of less than 3.5, and the spacing between said functional metal leads is less than one μm.

7. The semiconductor device of claim 6 wherein the spacing between said functional metal leads and said dummy leads is between ½ and 1½ the width of a said functional metal lead.

8. The semiconductor device of claim 6 further comprising a thin oxide layer over at least said low-dielectric constant insulating material.

9. The semiconductor device of claim 8 wherein:

said thin oxide layer has a thickness of less than the width of a said metal lead;

said low-dielectric constant insulating material has a low-dielectric constant of less than 2; and said metal leads have an aspect ratio greater than 2.

10. The device of claim 6 wherein said functional metal leads have an aspect ratio greater than 2.

11. A semiconductor device having metal leads with improved reliability, comprising:

a substrate;

at least two functional metal leads on said substrate;

a low-dielectric constant insulating material at least between said functional metal leads;

a thin oxide layer over at least said low-dielectric constant insulating material; and dummy leads on said substrate proximate said functional metal leads;

wherein said dummy leads are in such proximity to said functional metal leads as to dissipate Joule's heat from said functional metal leads, said low-dielectric constant insulating material has a dielectric constant of less than 3.5, and the spacing between said functional metal leads is less than one μm.

12. The semiconductor device of claim 11 wherein said thin oxide layer has a thickness of less than the width of a said functional metal lead.

13. The device of claim 11 wherein said functional metal leads have an aspect ratio greater than 2.

* * * * *